(12) United States Patent
Dawley

(10) Patent No.: US 11,058,013 B2
(45) Date of Patent: Jul. 6, 2021

(54) METHOD OF MANUFACTURING BATTERY MODULE AND INTERCONNECT BOARD ASSEMBLY WITH INTEGRATED PCB AND FLEX CIRCUIT

(71) Applicant: GM Global Technology Operations LLC, Detroit, MI (US)

(72) Inventor: Evan J. Dawley, Bloomfield Hills, MI (US)

(73) Assignee: GM Global Technology Operations LLC, Detroit, MI (US)

(*) Notice: Subject to any disclaimer, the term of this patent is extended or adjusted under 35 U.S.C. 154(b) by 353 days.

(21) Appl. No.: 16/285,952

(22) Filed: Feb. 26, 2019

(65) Prior Publication Data

US 2020/0275555 A1    Aug. 27, 2020

(51) Int. Cl.
| | |
|---|---|
| *B23K 1/00* | (2006.01) |
| *H05K 3/36* | (2006.01) |
| *H05K 3/32* | (2006.01) |
| *H05K 3/34* | (2006.01) |
| *H01R 43/02* | (2006.01) |
| *H01M 50/502* | (2021.01) |
| *B23K 103/10* | (2006.01) |
| *B23K 101/42* | (2006.01) |

(52) U.S. Cl.
CPC ........... *H05K 3/363* (2013.01); *B23K 1/0016* (2013.01); *H01M 50/502* (2021.01); *H01R 43/0256* (2013.01); *H05K 3/328* (2013.01); *H05K 3/341* (2013.01); *B23K 2101/42* (2018.08); *B23K 2103/10* (2018.08); *H01R 43/0207* (2013.01); *H01R 43/0214* (2013.01); *H01R 43/0221* (2013.01); *H05K 2201/041* (2013.01); *H05K 2201/10037* (2013.01); *H05K 2201/10151* (2013.01); *H05K 2201/10272* (2013.01); *H05K 2203/107* (2013.01)

(58) Field of Classification Search
CPC .... H01L 2924/00; H05K 1/147; H05K 1/189; H05K 3/363; H05K 1/118; B23K 2101/40
See application file for complete search history.

(56) References Cited

U.S. PATENT DOCUMENTS

| | | |
|---|---|---|
| 9,263,722 B2 | 2/2016 | Ikeda et al. |
| 2006/0252310 A1 | 11/2006 | Yamada et al. |
| 2010/0143788 A1 | 6/2010 | Koh et al. |
| 2010/0198142 A1 | 8/2010 | Sloan et al. |
| 2015/0072193 A1 | 3/2015 | Balk et al. |
| 2017/0118838 A1 | 4/2017 | Williams et al. |

(Continued)

*Primary Examiner* — Erin B Saad
(74) *Attorney, Agent, or Firm* — Quinn IP Law

(57) ABSTRACT

A method of manufacturing an interconnect board (ICB) assembly for a battery module, the ICB assembly having a printed circuit board assembly (PCBA) and a carrier frame, includes depositing solder paste onto a printed circuit board (PCB) and/or a flexible printed circuit (flex circuit). The flex circuit has a conductive foil substrate coated with insulating material, and defines tabular flying leads radially-projecting from the flex circuit's periphery. The method may include positioning the PCB adjacent to the flex circuit such that the PCB and flex circuit are in direct contact along a flex interface surface of the PCB, and integrally joining the PCB and flex circuit along the interface surface to form the PCBA. The PCBA connects to the carrier frame to construct the ICB assembly. The battery module may be manufactured by connecting the ICB assembly to battery cells of the battery module.

20 Claims, 11 Drawing Sheets

(56) References Cited

U.S. PATENT DOCUMENTS

| | | |
|---|---|---|
| 2018/0076491 A1 | 3/2018 | Shoji et al. |
| 2018/0175358 A1 | 6/2018 | Lin et al. |
| 2018/0198110 A1 | 7/2018 | Zeng |
| 2018/0248167 A1 | 8/2018 | Hashizawa et al. |
| 2019/0123334 A1 | 4/2019 | Kataoka et al. |
| 2020/0091494 A1 | 3/2020 | Fernandez-Galindo et al. |

METHOD OF MANUFACTURING BATTERY MODULE AND INTERCONNECT BOARD ASSEMBLY WITH INTEGRATED PCB AND FLEX CIRCUIT

INTRODUCTION

The present disclosure generally relates to methods of manufacturing electrochemical battery modules and associated battery sensing and monitoring circuitry. Battery packs constructed from one or more battery modules are often used as direct current (DC) power supplies, e.g., in vehicle powertrains, powerplants, and as components of other mobile and stationary systems. Electrical energy stored within interconnected battery cells of the battery modules is directed as needed within the system, such as to energize the phase windings of a polyphase electric machine or to directly power a DC device.

A polyphase/alternating current (AC) electric machine typically includes a stator disposed with respect to a rotor. When the AC electric machine is configured as an AC motor, a polyphase voltage is applied to the stator's conductive windings to generate an alternating electromagnetic field around the stator. The resulting field interaction between the stator field and the rotor's magnetic field generates torque on the rotor, which may be directly or indirectly transmitted to a coupled load, e.g., via an intervening gear arrangement. Likewise, an electric generator driven by mechanical rotation in the system may generate and direct electricity back into the individual battery cells to thereby recharge the battery pack. Charging and discharging currents, individual cell voltages, states of charge, battery temperatures, and other relevant battery parameters may be closely monitored and regulated in real-time by an electronic battery controller in the above-described system and other systems so as to optimize the performance and operating life of the battery pack.

SUMMARY

Various method embodiments for manufacturing a battery module are disclosed herein. The envisioned battery module may be used in a battery system having an external battery controller that is in communication with the battery module, with battery controller referred to herein as a Battery System Manager (BSM). The BSM ultimately monitors and controls the flow of electrical energy to and from individual battery cells of the battery module, monitors the battery module's ongoing state of health, and possibly provides other battery control functions. Additionally, the BSM may periodically initiate cell balancing functions and/or thermal regulation operations, with these and other functions facilitated by the present teachings. The construction of the battery module is intended to facilitate the operations of the BSM.

The battery module includes an interconnect board assembly ("ICB assembly") constructed according to the various embodiments of the method as set forth below. The ICB assembly may have a printed circuit board assembly ("PCBA") that is mounted to a carrier frame. The PCBA is integrally constructed from two main components: a cell sense printed circuit board ("PCB") and a thin, flexible printed circuit ("flex circuit"). The ICB assembly also includes conductive busbars, e.g., alternating copper and aluminum busbars in a possible embodiment, or busbars constructed of the same material, e.g., aluminum, copper, bimetal, or a combination thereof. A respective surface of each busbar is conductively joined to the flex circuit as part of the method, while the respective busbars conductively contact and/or are conductively joined to a corresponding electrode terminal of a given battery cell. The ICB assembly, directly and/or via the PCB, may communicate with the above-noted BSM over a wireless/radio frequency (RF) link and/or by transmitting signals over a hardwired set of transfer conductors.

An example method of manufacturing the ICB assembly includes depositing solder paste onto the PCB and/or the flex circuit. The flex circuit, which has a conductive foil substrate coated with insulating material, defines tabular flying leads that project from the flex circuit's periphery. The method further includes positioning a substantially rigid printed circuit board (PCB) immediately adjacent to the flex circuit, such that the PCB and flex circuit are in contact along a flex interface surface of the PCB. The PCB and the flex circuit are then integrally joined to form the PCBA, which may be connected to the carrier frame to thereby construct the ICB assembly.

Integrally joining the PCB and flex circuit may include subjecting the PCB and flex circuit to a reflow soldering process. In some embodiments, the integral joining is conducted concurrently via the reflow soldering process. Alternatively, the joining of the PCB and flex circuit may include using heat-cured or room temperature-cured electrically-conductive adhesive materials.

The method may include populating at least one component surface of the PCB with electronic components collectively configured to measure parameters of the battery module.

Depositing solder paste onto at least one of the PCB and the flex circuit may include depositing solder paste onto discrete solder lands of the flex circuit, for instance.

The carrier frame may include the busbars, with the method possibly including the conductive joining of the PCBA to such busbars.

Some embodiments of the method include seating the PCBA on a support surface of the carrier frame, such that each respective one of the flying leads is adjacent to a corresponding busbar. Conductively joining the PCBA to the busbars in this embodiment may include conductively joining an uninsulated portion of the flying leads to a respective one of the busbars. Conductively joining the PCBA to the busbars may optionally include using a laser welding process, an ultrasonic welding, or a resistance welding process to weld the flying leads to the busbars.

Another embodiment of the method may include applying potting or over-molding material to coat at least a portion of the carrier frame and at least a portion of the PCBA.

The method may include populating a component surface of the PCB with electronic components prior to integrally forming the PCB and flex circuit.

A method of manufacturing the battery module is also disclosed. The method may include connecting the PCBA to the carrier frame to construct the ICB assembly, which in turn may include conductively joining an uninsulated portion of each the flying leads to corresponding conductive busbar of the carrier frame, and conductively joining the ICB assembly to the battery cells to form the battery module.

The above summary is not intended to represent every embodiment or aspect of the present disclosure. Rather, the foregoing summary exemplifies some of the novel aspects and features set forth herein. The above-noted and other features and advantages of the present disclosure will be readily apparent from the following detailed description of representative embodiments and modes for carrying out the present disclosure when taken in connection with the accompanying drawings and the appended claims.

Figure 1:
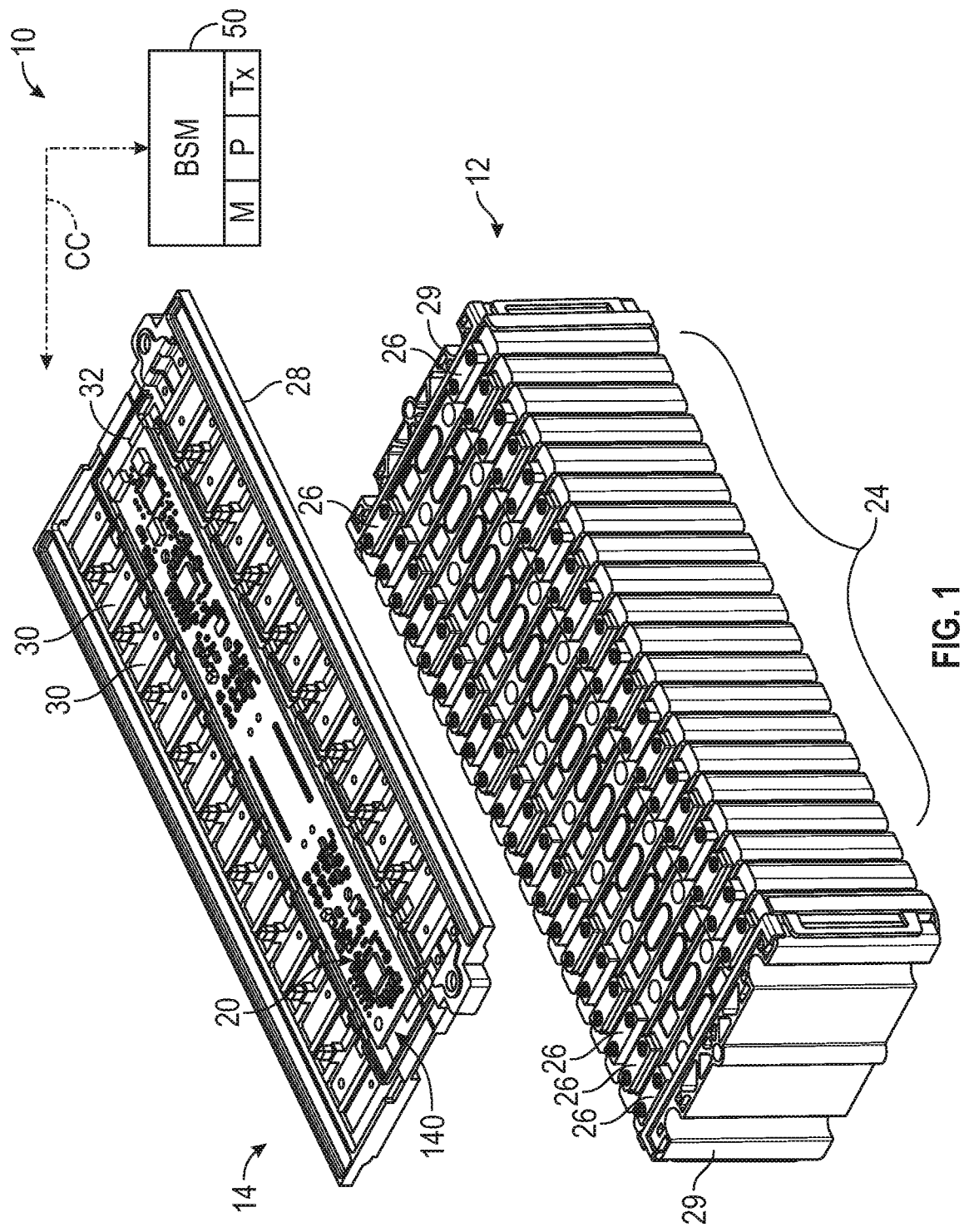
FIG. 1 is a partially-exploded perspective view illustration of a battery system according to an embodiment, with the battery system including a battery controller and a battery module having an interconnect board assembly ("ICB assembly") constructed of an integrally-formed printed circuit board ("PCB") and flexible printed circuit ("flex circuit") as described in detail herein.

The present disclosure may have various modifications and alternative forms, and some representative embodiments are shown by way of example in the drawings and will be described in detail herein. Novel aspects of this disclosure are not limited to the particular forms illustrated in the above-enumerated drawings. Rather, the disclosure is to cover modifications, equivalents, and combinations falling within the scope of the disclosure as encompassed by the appended claims.

DETAILED DESCRIPTION

As used herein with respect to disclosed values or ranges, the term "about" indicates that the stated numerical value allows for slight imprecision, e.g., reasonably close to the value or nearly, such as ±10 percent of the stated values or ranges. If the imprecision provided by the term "about" is not otherwise understood in the art with this ordinary meaning, then "about" as used herein indicates at least variations that may arise from ordinary methods of measuring and using such parameters. In addition, disclosure of ranges includes disclosure of values and further-divided ranges within the entire range.

Referring to the drawings, wherein like reference numerals are used to identify like or identical components in the various views, a battery system 10 is shown in FIG. 1. The battery system 10 may include a battery module 12 and a master battery controller, with such a controller referred to hereinafter as a battery system manager (BSM) 50. The BSM 50 communicates with the battery module 12 via an interconnect board assembly ("ICB assembly") 14 of the battery module 12, as indicated by a double-headed arrow CC. The two-way communication may occur over hard-wired transfer conductors and/or wirelessly over a suitable radio frequency (RF)-based link and communications protocol.

Figure 5:
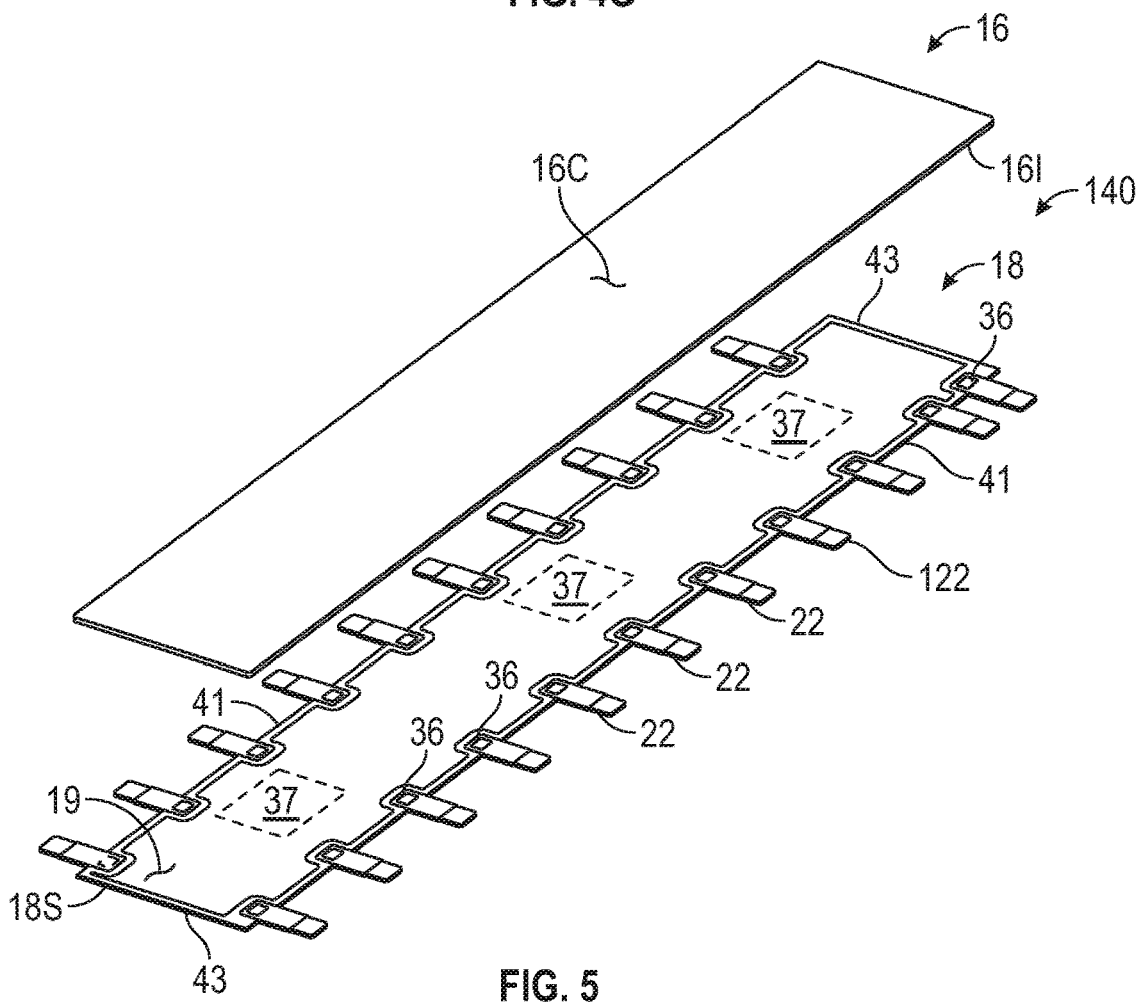
FIGS. 5-7 are schematic perspective exploded-view illustrations of alternative configurations of the PCBA shown in FIG. 2.

In general, and as best shown in FIG. 5, the ICB assembly 14 of FIG. 1 includes a printed circuit board assembly ("PCBA") 140, the integral components of which include a printed circuit board ("PCB") 16 and a flexible printed circuit ("flex-circuit") (FLX) 18. The PCB 16 and flex circuit 18 are integrally formed or constructed, such as by using a reflow surface-mounted technology (SMT)-based soldering process or other suitable fabrication process as set forth herein. When the ICB assembly 14 of FIG. 1 is configured as described herein, manufacturing of the ICB assembly 14, and therefore the battery module 12, may be streamlined relative to alternative processes so as to reduce the number and order of manufacturing process steps needed for joining the cell-monitoring PCB 16 to the flex circuit 18.

Figure 2:
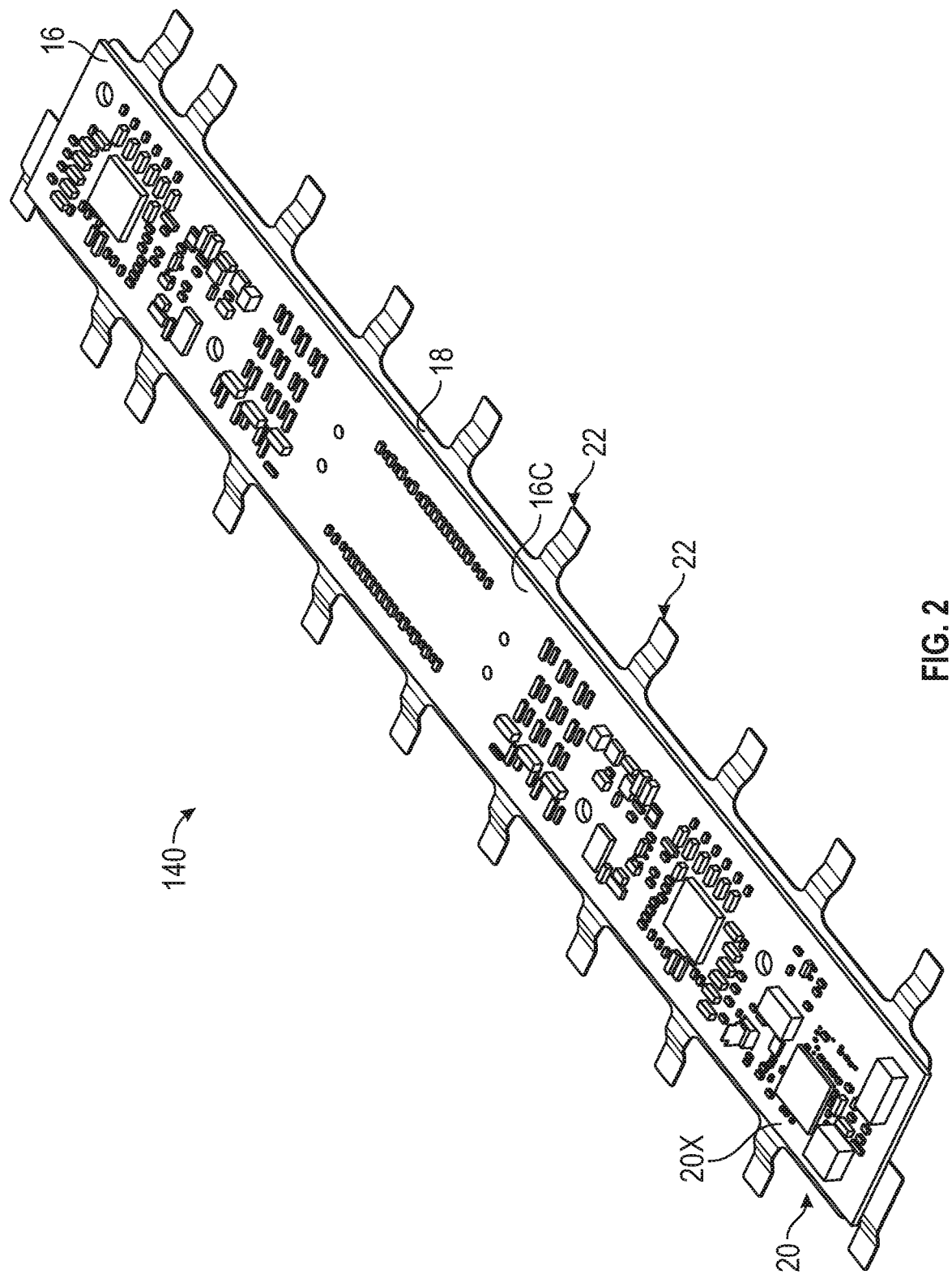
FIG. 2 is a schematic perspective view illustration of an embodiment of a printed circuit board assembly ("PCBA") that may be used as part of the ICB assembly shown in FIG. 1.

Further with respect to the BSM 50 of FIG. 1, this electronic battery control device or a network of such devices may include one or more digital computers each one having a processor (P) and sufficient amounts and types of memory (M), e.g., read only memory, random access memory, and electrically-erasable programmable read only memory. As noted above, the BSM 50 may be optionally placed in wireless communication with the ICB assembly 14. In such an embodiment, the BSM 50 may include an RF transceiver (Tx) configured to receive wireless signals from the ICB assembly 14, e.g., a corresponding RF transmitter 20X thereof as shown in FIG. 2, to enable the two-way communications indicated by double-headed arrow CC. Example battery parameters that may be wirelessly communicated to and/or from the BSM 50 include cell voltages, temperatures, thermal regulation and/or cell balancing control signals, and other application-specific values, as well as control signals from the BSM 50 that command a particular change of state of the battery module 12, e.g., during a cell charge balancing process. The BSM 50 may execute software programs using the processor (P) in the overall operational control of the battery module 12 and/or a battery pack (not shown) within which the battery module 12 is used.

In a possible embodiment, an RF communications circuit of the BSM 50 using the above-noted RF transceiver (Tx) may employ a 2.4 GHz protocol over a secure wireless network, such that battery data is transmitted using low-power radio waves. As will be appreciated, 2.4 GHz protocols generally encompass a frequency range of about 2.402-2.480 GHz. Other RF frequency ranges, including emerging 5 GHz protocols or earlier protocols operating in the sub-1 GHz spectrum, may be used within the scope of the present disclosure.

FIG. 2 is a perspective view illustration of the PCBA 140 noted above with reference to FIG. 5, and shows the PCB 16 after being integrally joined to the flex circuit 18. The PCB 16 has at least one component surface 16C, e.g., an upper surface as viewed from the perspective of FIG. 2 and/or a lower surface, and cell sense and monitoring electronic components 20 mounted to the component surface(s) 16C. As will be appreciated by those of ordinary skill in the art, the various electronic components 20 may include application-specific integrated circuits (ASICs), memory chips, resistors, capacitors, diodes, etc. One or more of the electronic components 20 may be configured as the RF transceiver component 20X so as to enable the PCBA 140/ICB assembly 14 to communicate wirelessly with the RF transceiver (Tx) of the BSM 50 as depicted in FIG. 1. The illustrated configuration and placement of the electronic components 20 in FIG. 2 is non-limiting, and may vary depending on the application of the PCBA 140 and battery module 12.

The flex circuit 18 depicted in FIG. 2 defines a plurality of radial tabs which are spaced around its periphery. Such radial tabs, which are referred to hereinafter and in the general art as "flying leads" 22, extend radially-outward from the periphery of the flex circuit 18, and may be evenly or unevenly spaced or distributed depending on the embodiment. The flying leads 22 are ultimately conductively joined to the battery cells 24 of FIG. 1 via a corresponding busbar 30, e.g., via laser welding, ultrasonic welding, or resistance welding, as shown in FIG. 1.

The PCB 16 of FIG. 2 may be populated with the electronic components 20, e.g., using a pick-and-place process, and positioned with respect to the flex circuit 18. The adjacent PCB 16 and flex circuit 18 may be subjected to the above-noted reflow SMT soldering process, with optional variations thereof described below with reference to FIGS. 11A-11D, so as to integrally and permanently join the PCB 16 and flex circuit 18 into the unitary PCBA 140. The electronic components 20 collectively monitor and report the present state of the battery module 12 to the BSM 50 of FIG. 1 and/or to other electronic control units depending on the intended application of the battery system 10, with electrical and communications connectivity to the battery cells 24 of FIG. 1 facilitated by the integral connection of the PCB 16 to the flex circuit 18.

Figure 10:
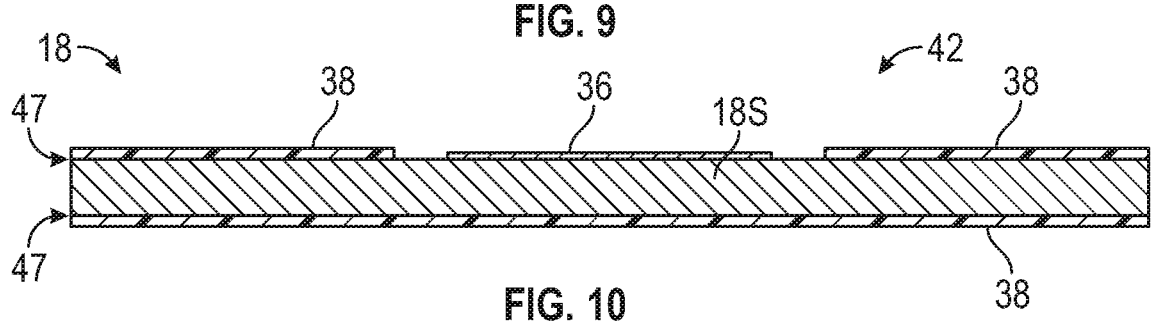
FIG. 10 is a schematic cross-section illustration of a portion of the flex circuit usable as part of the PCBA shown in FIG. 2.

Referring briefly to FIG. 10, the flex circuit 18 is shown in schematic cross-sectional view in proximity to a discrete solder pad or landing 36. The solder landing 36 is exposed through an insulation gap 42, as will be described below with reference to FIG. 5. The flex circuit 18 is configured to transfer measured voltage and/or temperature signals from individual cell terminals 26 of the battery cells 24, both shown in FIG. 1. The flex circuit 18 in its various embodiments is constructed of a thin substrate 18S of conductive material, e.g., metal foil.

The term "thin" is in relation to a corresponding thickness of the PCB 16, and therefore may vary with the application, but in general is less than about 0.2 mm. The substrate 18S may be coated with an electrically-insulating layer 38, e.g., polyethylene naphthalate (PEN), polyethylene terephthalate (PET), polyimide (PI), etc. An adhesive binder layer 47 such as epoxy may be used to adhere the substrate 18S to the insulating layer 38, or the insulating layer 38 may be self-adhering. Alternatives may be envisioned. For instance, in lieu of the discrete solder lands 36 as shown in FIG. 10, one or both major surfaces of the substrate 18S may be deposited or plated with material, e.g., copper and/or nickel when the substrate 18S is aluminum, with the insulation gaps 49 exposing a designed area of the conductive material to define the discrete solder lands 36.

The primary material used to construct the substrate 18S may be aluminum in some embodiments, without limiting the construction to such a material. If copper is used for the substrate 18S, for instance, a material other than copper may be deposited or plated onto the copper substrate 18S as the solder lands 36 to enhance soldering. As disclosed above, the deposition/plating process may be performed globally on the entirety of the substrate 18S, and thus need not be locally applied. In any case, the boundaries of the solder lands 36 coincide with the boundaries of the insulation gaps 49, through which the solder material is reflowed during an SMT soldering process.

Referring briefly to FIGS. 11A-11D, one or two surfaces of the PCB 16 may be used as component surfaces 16C in different embodiments. Additionally, a flex interface surface 16I is defined herein as being the particular surface of the PCB 16 that is integrally joined to the flex circuit 18. That is, the term "interfacing" refers to immediately-adjacent and abutting surfaces of the PCB 16 and flex circuit 18, which may or may not also be a component surface 16C.

Figure 11A:
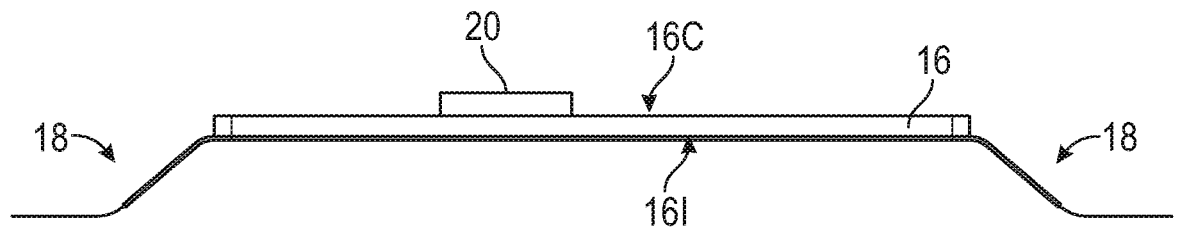
FIGS. 11A-D are schematic side view illustrations of various PCB-flex circuit configurations for use in the PCBA shown in FIG. 2.
Figure 11B:
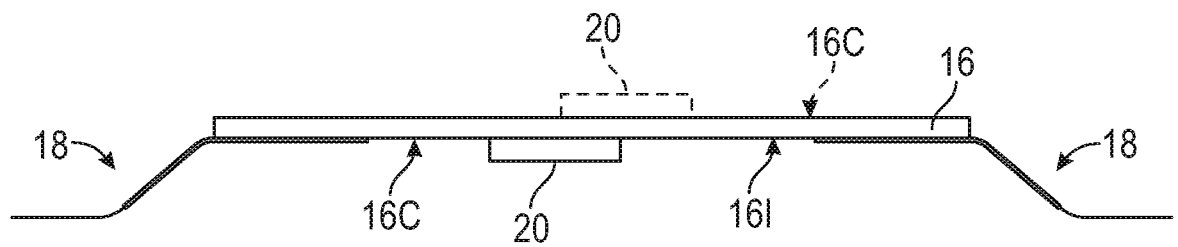
Figure 11C:
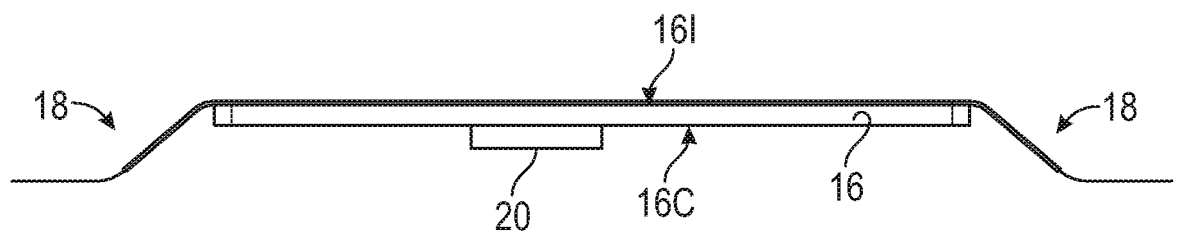

For instance, FIG. 11A shows an example embodiment in which the component surface 16C populated with an example electronic component 20 is located diametrically opposite to the flex interface surface 16I. By comparison, FIG. 11B shows a component surface 16C and a flex interface surface 16I located on the same side of the PCB 16. Optionally, another component surface 16C may be diametrically-opposite the flex interface surface 16I in a possible two-sided population of the PCB 16. FIG. 11C essentially flips the configuration of FIG. 11A, such that the component surface 16C and the example electronic component 20 are diametrically opposite the flex interface surface 16I, with the flex circuit 18 situated above the PCB 16 from the perspective of FIG. 11C and below the PCB 16 from the perspective of FIG. 11A. A window 45 in the flex circuit 18, described below with reference to FIGS. 6 and 7, may be used in the example configurations of FIGS. 11B and 11D to allow the electronic component(s) 20 to protrude at least partially through the window 45, e.g., to enable certain packaging options.

Referring once again to FIG. 1, the battery module 12 includes the battery cells 24 previously noted above. The battery cells 24 may be enclosed in or surrounded by a protective housing, two endplates 29 of which are visible in FIG. 1 and two lateral/side plates of which are omitted for illustrative clarity. Also omitted is a battery cover spanning the battery module 12 and thereby preventing dirt, moisture, and debris from contacting the ICB assembly 14 and/or the battery cells 24. The battery module 12 may include an application-suitable number of such battery cells 24, such as twenty battery cells 24 in the illustrated example embodiment, or more or fewer battery cells 24 in other embodiments. While one battery module 12 is shown in FIG. 1 for illustrative simplicity, several battery modules 12 may be interconnected to form a battery pack having an application-suitable voltage level, as will be appreciated by those of ordinary skill in the art.

Each constituent battery cell 24 of the battery module 12 shown in FIG. 1 includes corresponding cell electrode terminals 26 having alternating positive and negative polarities. While "can-style" battery cells 24 are depicted, other embodiments of the battery cells 24 may be used within the scope of the disclosure, including but not limited to foil pouch-style battery cells having protruding foil tab extensions or other types of battery cells.

The ICB assembly 14 includes a carrier frame 28, which in turn may be optionally embodied as a generally flat, rectangular tray structure constructed of heat-resistant molded plastic. Alternatively, the carrier frame 28 may be constructed of an insulated metal and/or a dielectric material configured to support and expose the conductive busbars 30 around the peripheral edges of the carrier frame as shown. The busbars 30 may be constructed of aluminum in an embodiment, which facilitates laser welding of the flying leads 22 when the flying leads 22 are likewise constructed of aluminum. In other configurations, the busbars 30 and flying leads 22 may be constructed of materials other than aluminum, e.g., copper. Dissimilar materials may be used in other embodiments, such as aluminum busbars 30 and copper flying leads 22, or vice versa. Flying leads 22 with a surface treatment may be constructed in the same manner as the solder landings to facilitate attachment to the busbars 30, e.g., aluminum flying leads 22 may have copper disposed on the surface(s) to facilitate conductively joining or welding to copper busbars 30.

The carrier frame 28 shown in FIG. 1 may include a support surface 32 on which the PCBA 140 is disposed, with the support surface 32 flanked by the busbars 30 in the illustrated embodiment. When the PCBA 140 is shaped as an elongated rectangle, for instance, the support surface 32 may have a complementary elongated rectangular shape. Other shapes of the PCBA 140 and the support surface 32 may be used within the scope of the disclosure, e.g., square, oval, irregular, etc., but would typically have complementary/matching shapes so that the PCBA 140, once seated, rests or nests securely on and/or within the support surface 32.

The ICB assembly 14 may be fastened or otherwise securely joined to the battery module 12, e.g., using lugs, screws, snaps, and/or welding, which forces the cell electrode terminals 26 either into continuous conductive contact with or close proximity to a corresponding busbar 30. The busbars 30 may be conductively joined to the cell electrode terminals 26 using a suitable welding process, e.g., laser welding. The flying leads 22 are conductively joined to the busbars 30 via laser welding, ultrasonic welding, resistance welding, weld bonding, and/or another suitable process, which may occur at the same time or subsequent to when the busbars 30 are joined to the cell electrode terminals 26. Optionally, the flying leads 22 may be attached to the busbars 30 prior to welding the busbars 30 to the cell electrode terminals 26 of the battery cells 24. As another optional embodiment, the flying leads 22 may be attached to the busbars 30 prior to loading the ICB assembly 14 to the battery module 12 of FIG. 1.

Figure 3:
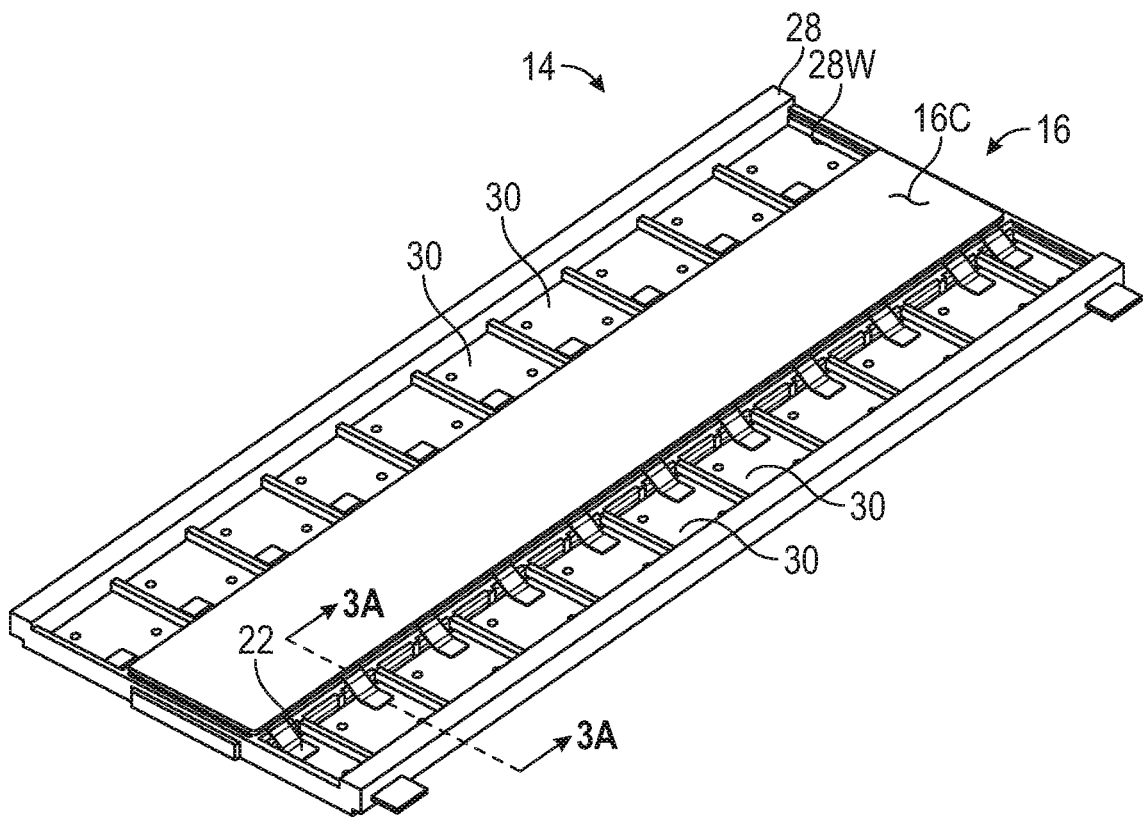
FIG. 3 is a schematic perspective view illustration of an ICB assembly usable as part of the battery module shown in FIG. 1.
Figure 3A:
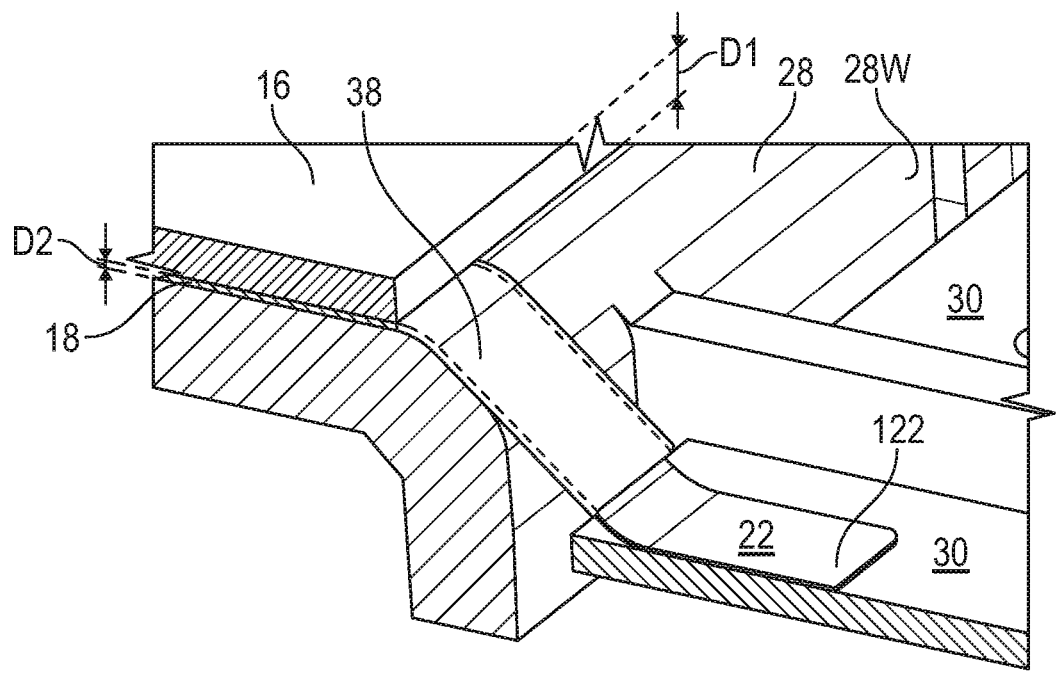
FIG. 3A is a perspective view illustration of a portion of the ICB assembly of FIG. 3 taken along cutline 3A-3A.

FIGS. 3 and 3A show an embodiment of the carrier frame 28 for the ICB assembly 14, which includes and/or supports the above-noted busbars 30, such as by disposing a corresponding one of the busbars 30 in an individual tray window 28W. As best shown in the close-up view of FIG. 3A taken along cutline 3A-3A of FIG. 3, the PCB 16 has a thickness (D1) that substantially exceeds a thickness (D2) of the flex circuit 18. The thickness (D1+D2), minus a height of the electronic components 20 (see FIG. 2), may be about 2 mm in some embodiments, with thickness D2 being on the order of about 0.2 mm or less as noted above.

Unlike the PCB 16, which may be constructed largely of a substantially-rigid substrate of solder-masked fiberglass epoxy resin or other semi-rigid substrate material, the flex circuit 18 contemplated herein is constructed of a thin, flexible foil substrate 18S and insulation material 38, as shown in FIG. 10. An uninsulated terminal end 122 of each respective flying leads 22 may be gently deflected or angled into contact or close proximity with a corresponding busbar 30 and thereafter securely welded into place. One advantage of using a metal foil construction for the flex circuit 18 is the resulting improvement in strain relief, particularly at or along welds joining the flex circuit 18 to the PCB 16. While an uninsulated terminal end 122 is shown in FIG. 3A, it is also possible to extend the insulation material 38 out to the edge of the terminal end 122 and provide an opening in the insulation material 38 large enough to permit welding.

Figure 4:
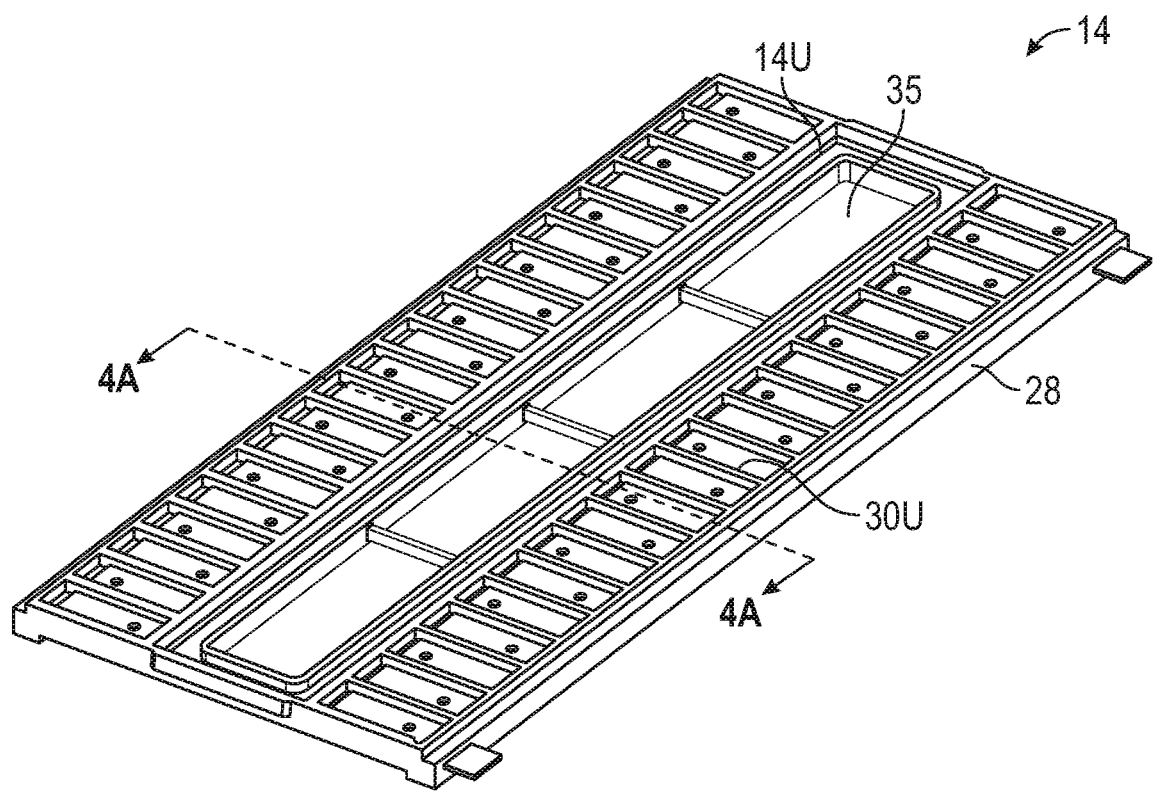
FIG. 4 is a schematic perspective view illustration of an underside of the ICB assembly shown in FIG. 3 subsequent to an optional potting or over-molding process.
Figure 4A:
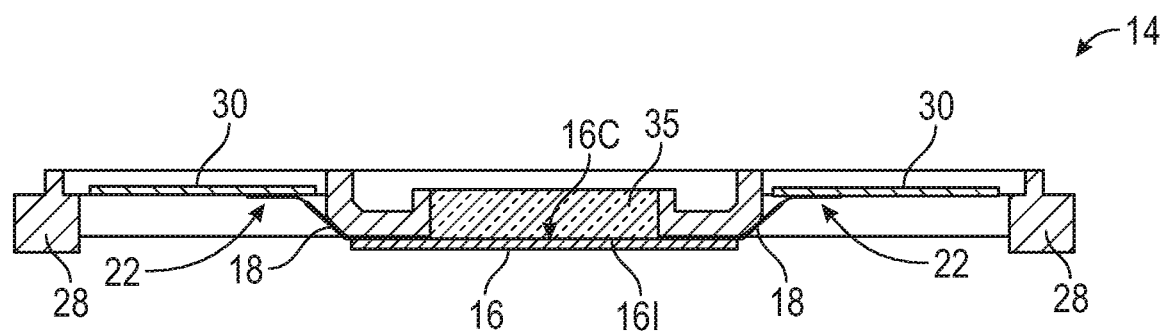
FIG. 4A is a schematic cross-sectional side view illustration of the ICB assembly taken along cutline 4A-4A of FIG. 4.

FIG. 4 shows an underside 14U of the ICB assembly 14. FIG. 4A is taken along cut line 4A-4A of FIG. 4, and corresponds generally to the arrangement depicted in FIG. 11B as described above. Once the PCB 16 is integrally formed with the flex circuit 18 to form the PCBA 140 of FIG. 2, portions of the carrier frame 28 and other components may be coated to a suitable depth by potting or over-molding material 35. As will be appreciated, potting or over-molding involves covering or encapsulating the electronic components 20 and/or electrical interfaces thereof for increased reliability. Using a low-pressure molding process, designated portions of the PCBA 140 may be encapsulated to seal the desired interfaces. The material 35 may be a silicone-based material, epoxy-based resin, polyamide, plastic gel, or a thermosetting, room temperature-curable, or ultraviolet (UV)-curable material in various non-limiting embodiments, with such materials providing added protection and corrosion resistance to coated surfaces. Exposed undersurfaces 30U of the busbars 30 ultimately contact or are conductively joined to the cell electrode terminals 26 of FIG. 1 to complete an electrical circuit during assembly of the battery module 12.

Figure 4B:
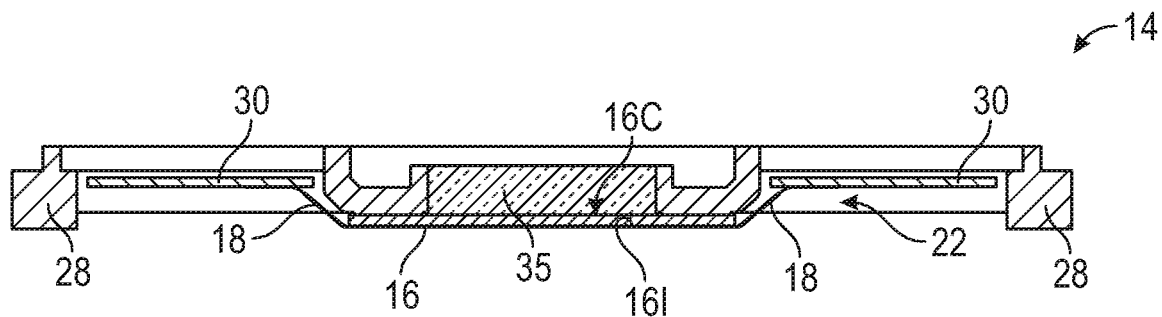
FIGS. 4B-4G are schematic cross-sectional side view illustrations of alternative embodiments of the ICB assembly shown in FIG. 4.
Figure 4C:
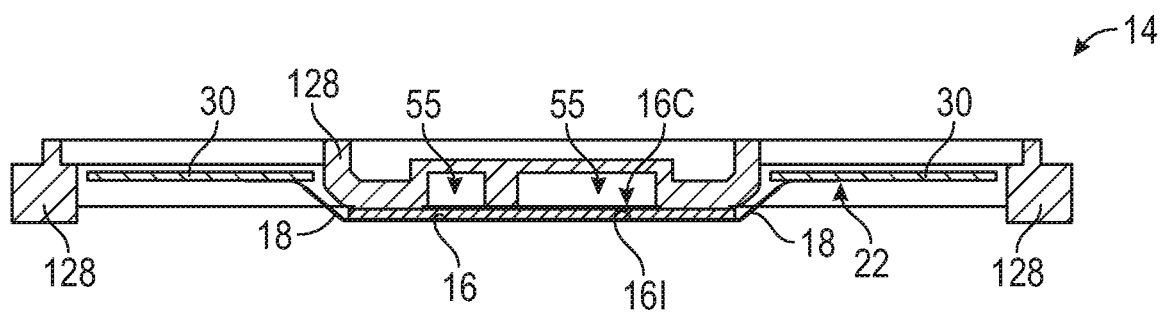
Figure 4D:
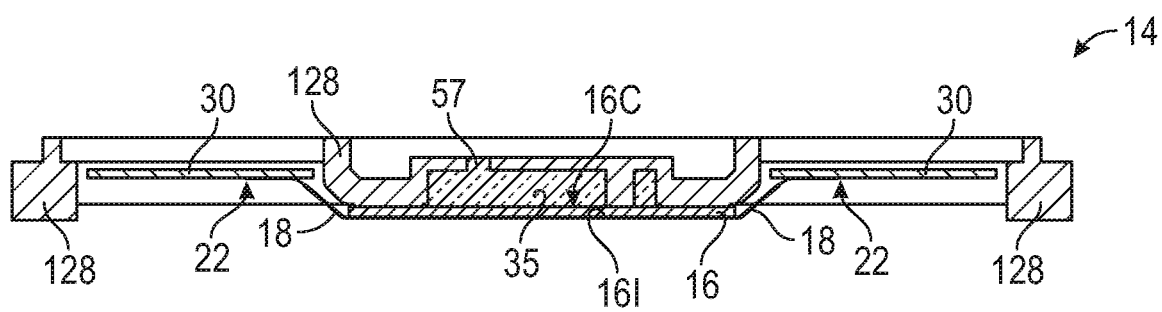
Figure 4E:
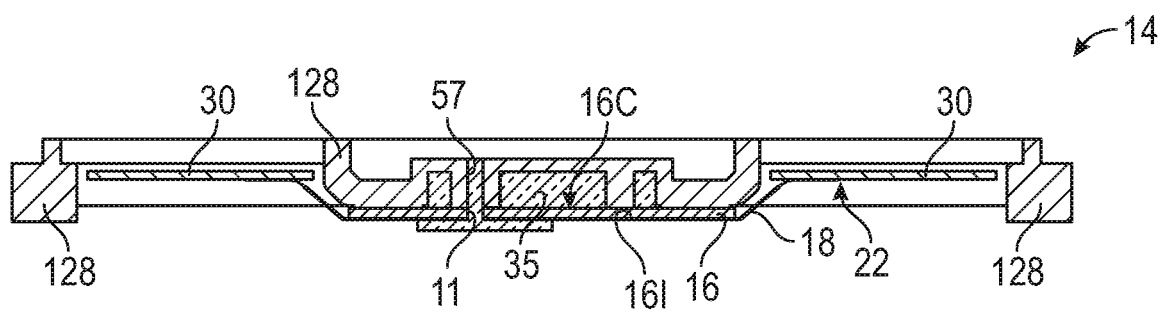

FIGS. 4B-4E show alternative potting or over-molding arrangements usable within the scope of the disclosure. FIGS. 4A and 4B correspond to the relative positioning of the flex circuit 18 and PCB 16 as shown in FIGS. 11C and 11 B, respectively. Thus, components 20 of FIG. 2 situated on the single component surface 16C may be encapsulated in the potting or over-molding material 35. FIGS. 4C and 4D, on the other hand, both show an optional carrier frame 128. In conjunction with the PCB 16, the carrier frame 128 may define cavities 55 that may be empty (FIG. 4C) or filled with the material 35 (FIG. 4D). To facilitate use of the material 35 in FIG. 4D, the carrier frame 128 may include a fill port 57 through which the material 35, e.g., potting material or another suitable over-molding material, may be injected into the cavities 55. FIG. 4E shows the embodiment of FIG. 4D, but with the addition of a through-hole 11 in the PCB 16 to allow the material 35 to flow onto the PCB 16, e.g., for extra protection of joints on the flex interface surface 161 or for additional mechanical retention.

Figure 4F:
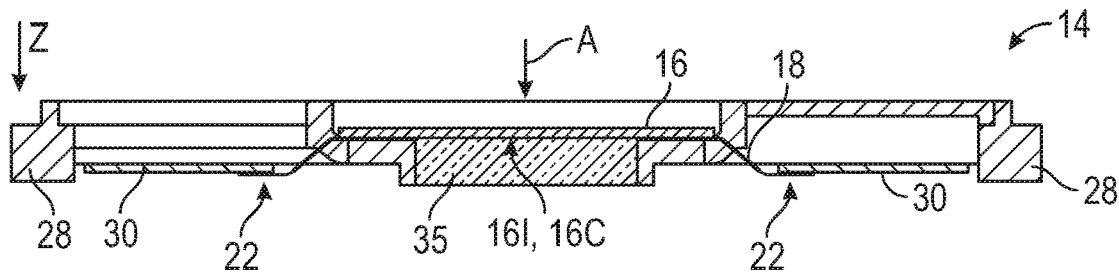

FIG. 4F depicts another embodiment in which the PCB 16 is installed from the bottom of the carrier frame 28, as indicated by arrow A. Arrow Z shows the typical upward Z-direction of a Cartesian coordinate frame of reference, such that a topside of the carrier frame 28 is located at the bottom of FIG. 4F. The PCBA 140 is installed to the carrier frame 28 in the direction of arrow A, with the potting or over-molding material 35 applied from the topside of the carrier frame 28. The embodiments of FIGS. 4C and 4D with cavities 55 may also be constructed in this manner.

Figure 4G:
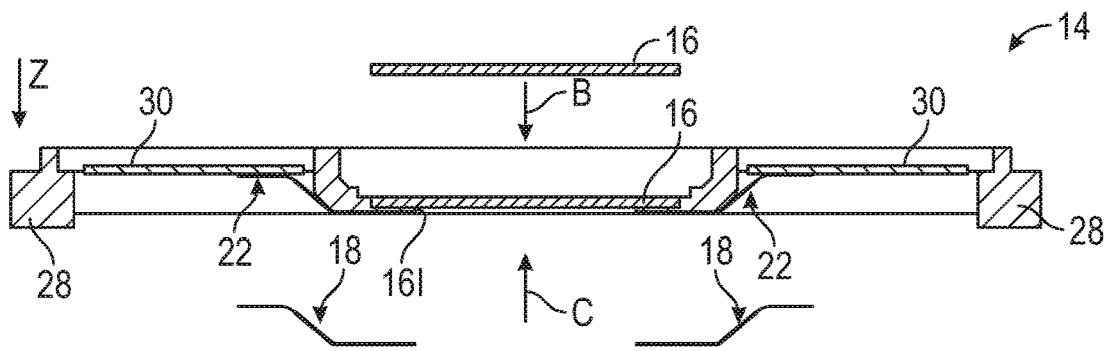
Figure 11D:
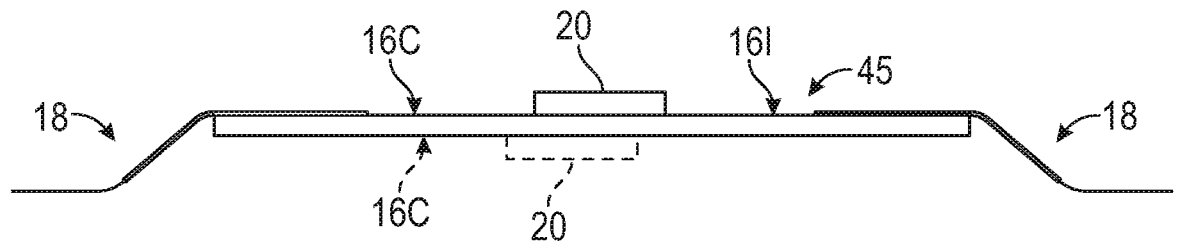

Referring to FIG. 4G, which may be used to construct the arrangements of FIGS. 11C or 11D, the ICB assembly 14 may be optionally constructed from separate pieces. For instance, the PCB 16 may be installed from the underside of the carrier frame 28 as indicated by arrow B. The flex circuit 18 may be installed to the flex interface surface 161, as indicated by arrow C. Thereafter, the entire ICB assembly 14 of FIG. 4G may undergo a reflow SMT soldering process, or the PCB 16 and flex circuit 18 may be selectively soldered or bonded, e.g., using a conductive adhesive material.

Referring to FIG. 5, the PCBA 140 of FIG. 2 is depicted in exploded view to further illustrate certain key structural details. The component surface 16C is visible from the perspective of FIG. 5, with the various electronic components 20 of FIG. 2 omitted for illustrative simplicity. For SMT process compatibility, the flex circuit 18 may include the localized/discrete landing surfaces 36 noted above, which may be constructed of a solderable material that is the same as or different from that which is used to construct the substrate 18S of the flex circuit 18, e.g., copper when the substrate 18S is aluminum. The flex circuit 18 may also include one or more adhesive patches 37, e.g., pressure-sensitive adhesive, which are shown schematically as square patches, but which may vary in size and/or location on the flex circuit 18. The use of such adhesive patches 37 may facilitate the temporary retention the PCB 16 and flex circuit 18 prior to undergoing the SMT soldering process.

Further with respect to the discrete solder landings 36, surface treatment material of the solder landings 36 may be deposited onto the flex circuit 18 using a suitable material deposition or plating process, at or just past a corresponding junction between each respective flying lead 22 and a major surface 19 of the flex circuit 18. The major surface 19 is defined herein as the area of the flex circuit 18 that is not coextensive with that of the flying leads 22, i.e., the landings 36 may be located on the major surface 19 immediately adjacent to the flying leads 22. The use of aluminum as the material of construction of the substrate 18S in conjunction with small pads of copper surface treatment as the solder landings 36 may be advantageous relative to approaches that start with a lamination or assembly of copper foil substrate 18S and aluminum flying leads 22 and etch the copper away, e.g., in terms of reduced copper content and associated material and process costs.

The flex circuit 18 is rectangular in the non-limiting example embodiment of FIG. 5, and thus has two facing, parallel elongated side edges 41 and two facing, parallel end edges 43. The flying leads 22 extend radially-outward from the elongated side edges 41. The actual number of flying leads 22 present on a given side edge 41 may differ from the depicted embodiments without changing the dimensions of the major surface 19. Such a feature may facilitate reconfiguration of the PCB 16 for use with different collections of components 20, e.g., for use with battery modules 12 having fewer battery cells 24 than those which are shown in FIG. 1. In this case, the PCB 16 of FIG. 5 retains the general footprint shown in FIG. 1, which in turn enables a common PCB 16 to be populated with different combinations of the electronic components 20 for use in multiple configurations of the battery module 12. Also, the exact PCB 16 including all of the electronic components 20 can be common/the same in different configurations of the battery module 12, e.g., the PCB 16 designed to sense signals from twenty battery cells 24 may also be used for sixteen battery cells 24.

In general, the configuration shown in FIG. 5 may be made by a process in which solder paste is dispensed onto the solder landings 36 of the flex circuit 18. Alternatively, solder paste may be dispensed onto corresponding solder pads 65 and/or 66 of the PCB 16 (see FIG. 7). The PCB 16 is populated with the various components 20 shown in FIG. 2, e.g., via a pick-and-place process, and then placed and mated to the flex circuit 18, or the flex circuit 18 may be picked, placed, and mated to the PCB 16. The adhesive patches 37 depicted in FIG. 5 may be used between the PCB 16 and the flex circuit 18 for added retention, as noted above. The PCB 16 and flex circuit 18 are then soldered via a reflow process to construct the above-described PCBA 140. Thereafter, the PCBA 140 is mounted to the carrier frame 28 and subjected to a welding process to electrically connect the flying leads 22 to the busbars 30. Flying leads 22 may also be joined to the busbars 30 with the same joining process used to join the busbars 30 to the cell electrode terminals 26.

Figure 6:
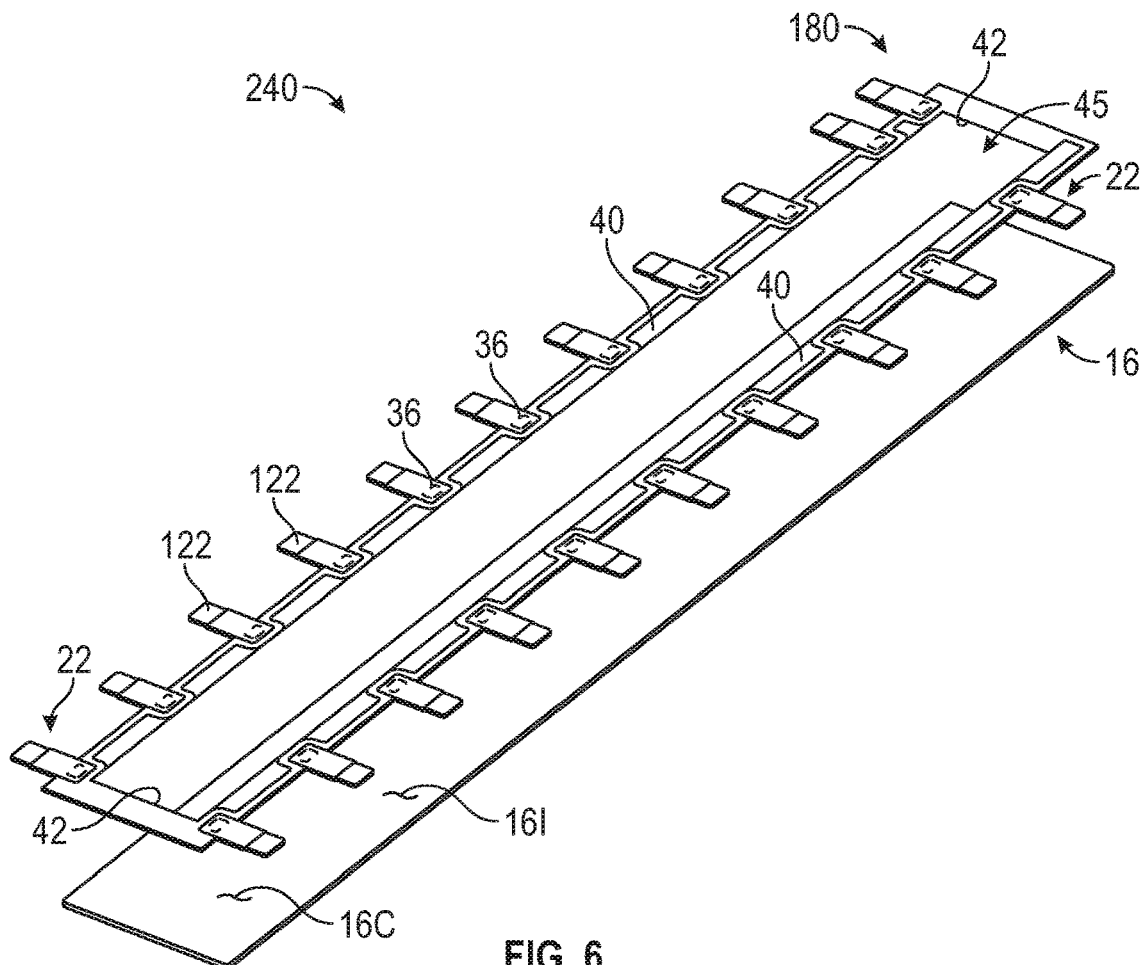

An alternative ICB assembly 240 is shown in FIG. 6. In this configuration, the above-described flex circuit 18 is replaced with an alternative flex circuit 180 in which material of the major surface 19 is removed to define the window 45 of FIGS. 11B and 11D. The window 45 is in turn defined by two perimeter side edges 40 and opposing end edges 42. Such an embodiment enables a single-sided design in which the component surface 16C is positioned adjacent to the flex circuit 18, with the components 20 protruding through the window 45, thus enabling different build configurations relative to the embodiment of FIG. 5. Thus, the interface surface 16I and the component surface 16C may be the same surface in some embodiments.

Figure 7:
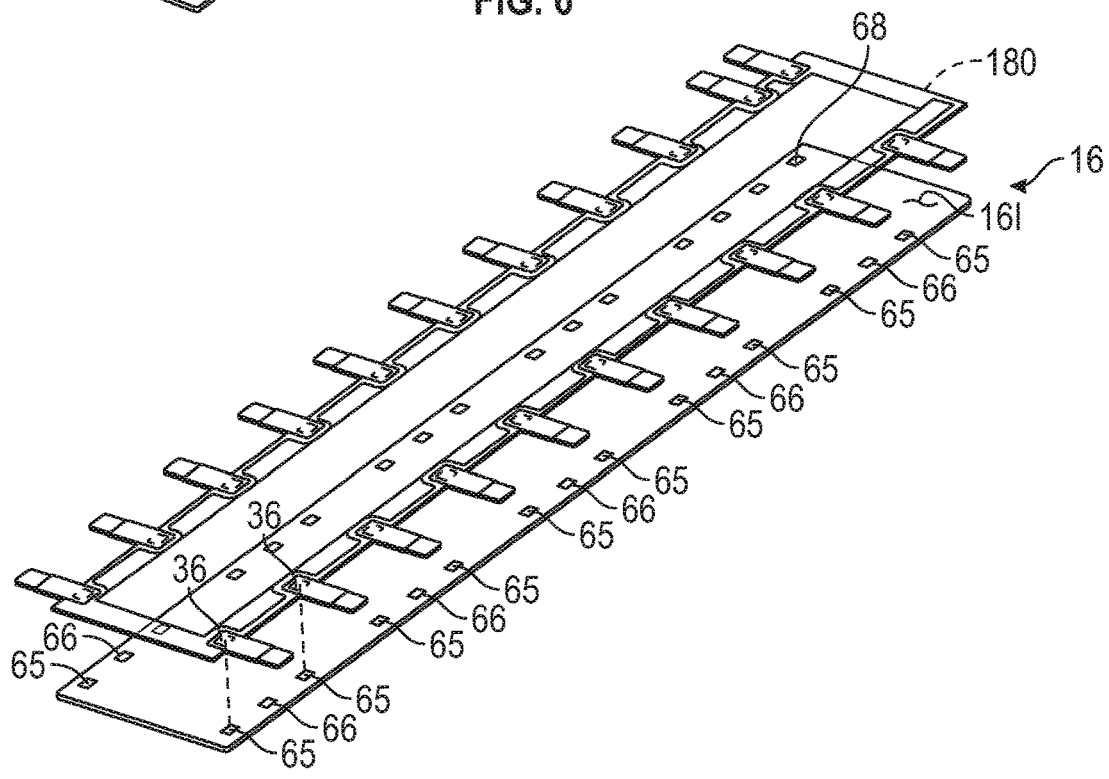

As shown in FIG. 7, the periphery of the PCB 16 may be optionally equipped with a plurality of solder lands 65. The spacing between and number of the solder lands 65 and/or 66 may vary depending on the configuration of the battery module 12 of FIG. 1. For instance, in an embodiment in which the PCB 16 is used with a battery module 12 having twenty battery cells 24 with each cell 24 electrically in series, twenty-one spaced solder pads 65 may be arranged around the periphery of the PCB 16. If the PCB 16 is used with a different battery module 12, e.g., one having twenty battery cells 24, with ten groups of two cells 24 electrically in parallel, eleven spaced solder pads 66 may be used around the periphery of the PCB 16.

Also as shown in FIG. 7, the PCB 16 may contain both solder lands 65 and 66, such that the same footprint and/or population of the electronic components 20 on the PCB 16 can be used for both the twenty cell 24 group and the ten cell group 24 configurations of the battery module 12. The flex circuit 18 may contain solder landings 36 corresponding to either pads 65 or 66, or solder landings 36 corresponding to both pads 65 and 66, in which case the solder pads 65 may be electrically connected to the flying leads 22 and solder pads 66 may be mechanically soldered but electrically unconnected, i.e., for aiding mechanical retention of the flex circuit 18 to the PCB 16.

An optional common/shared solder land 68 may be used in certain embodiments, with the solder land 68 being "common" or "shared" in the sense of its use in both of the example battery modules 12. The distance or pitch between adjacent solder pads 65 or 66 corresponds to the spacing or pitch between the busbars 30, which in turn is set by the configuration and spacing of the battery cells 24 of FIG. 1. Therefore, the number and spacing of solder pads 65 or 66 may vary with the intended application.

Figure 8:
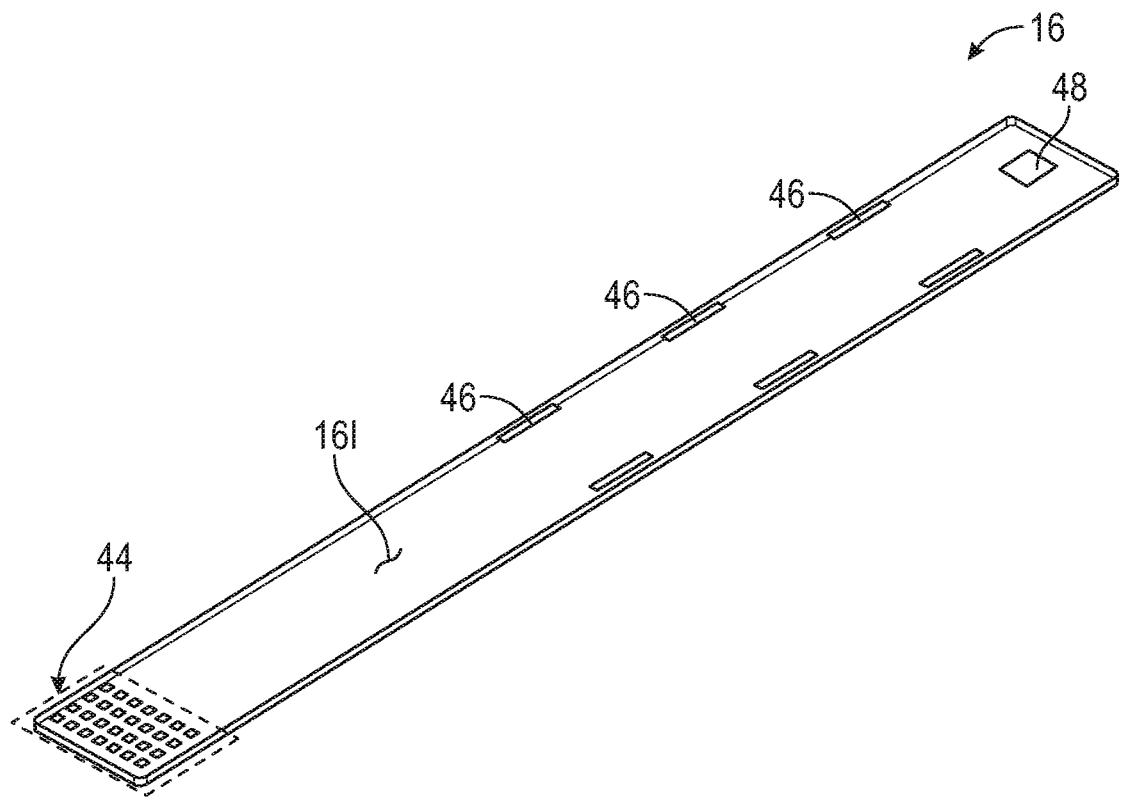
FIGS. 8 and 9 are schematic perspective view illustrations of a surface of the PCB shown in FIG. 1 according to two possible embodiments.

Referring to FIG. 8, other surface treatments of the PCB 16 may be used to achieve various performance advantages. For instance, a flip-chip or ball grid array (BGA)-approach may incorporate a BGA matrix 44 of both electrically functional and dummy mechanical solder connections. Elsewhere on the PCB 16, additional dummy solder connections 46 and 48 may be disposed around the periphery of the PCB 16. The BGA matrix 44 and the dummy solder connections 46 and 48 may be used to help increase the overall rigidity and structural integrity of the PCBA 140 and its various embodiments, as opposed to forming functional electrical connections.

Figure 9:
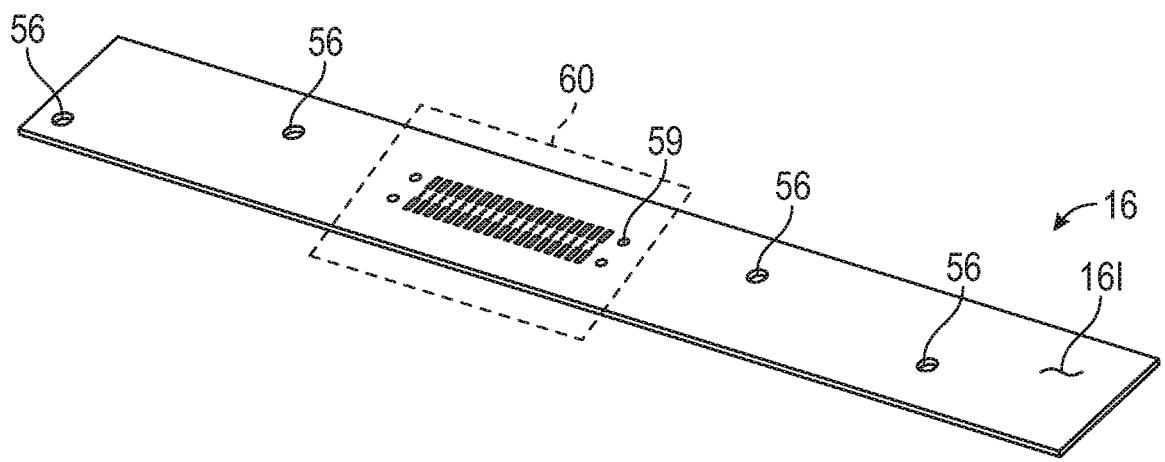

An alternative embodiment shown in FIG. 9 includes through-holes 56 formed in the PCB 16, e.g., for use with fasteners or snap-fit connectors to attach the PCB 16/PCBA 140 to the carrier frame 28 of FIGS. 1, 3, and 4. Additionally, solder pads 60 may be present on the flex interface surface 161 to facilitate a hot bar or reflow process, or the use of electrically conductive adhesive film or paste. Unlike FIG. 7 in which the solder pads 65 and/or 66 are distributed on the periphery, the solder pads 60 of FIG. 8 are disposed locally with smaller pitch/spacing, e.g., typically less than about 3 mm. The solder pads 60 enable the same benefits as the aforementioned embodiment in FIG. 7, e.g., the PCB 16 can remain common in footprint and/or in the population of electronic component 20 between different configurations of the battery module 12. Smaller holes 59 in the PCB 16, located on either side of the solder pads 60, may serve as fiduciary/alignment holes to help align mating parts during the bonding process. Such holes 56 and 59 may be present in the various disclosed embodiments as will be appreciated by one of ordinary skill in the art.

The ICB assembly 14 in its different embodiments as described above is thus tailored to optimize packaging size and manufacturing efficiency. One manner in which these and other objectives may be achieved is the use of a predominantly aluminum flex circuit 18 in combination with other electrical integration processes and distributed cell monitoring. The ICB assembly 14 is low profile relative to approaches using external connector-terminated flexible printed circuit or a discrete wiring harness. Additionally, the ICB assembly 14 may enable commonality of hardware across different embodiments of the battery module 12 as noted above, while at the same time increasing the percentage of surface area on the component surface(s) 16C available for population by the electronic components 20. When the disclosed structural features of the ICB assembly 14 are used in conjunction with wireless/RF transmission between the ICB assembly 14 and the BSM 50 of FIG. 1, the required packaging space for the ICB assembly 14 may enjoy an even lower profile. These and other possible benefits will be readily appreciated by those of ordinary skill in the art in view of the foregoing disclosure.

As noted above, a reflow soldering process, e.g., a surface-mounted technology (SMT) soldering process, may be used to manufacture the ICB assembly 14 and/or the PCBA 140 described above. As will be appreciated by those of ordinary skill in the art, SMT manufacturing processes enable conductive joining of the electronic components 20 that have been picked and placed onto the PCB 16. In effect, solder paste applied to the PCB 16 and/or the flex circuit 18 in the method 100 below acts as a glue providing added structural integrity. The use and precise control of a reflow soldering oven is central to the SMT process.

In general terms, as part of the SMT process the PCB 16 and the flex circuit 18 described above, along with solder paste that may be applied thereto, are slowly pre-heated at a controlled ramp rate to a calibrated first temperature. The PCB 16 and flex circuit 18 may be temperature soaked for a calibrated duration to evenly distribute heat in the PCB 16 and flex circuit 18, as well as to activate the applied solder paste. Such a pre-heating phase is conducted prior to reflow to remove volatile compounds from the solder paste, reduce thermal shock, and provide other process benefits as will be appreciated by one of ordinary skill in the art.

Upon reaching thermal equilibrium, the PCB 16 and flex circuit 18 are subjected to the above-noted reflow process during which the PCB 16 and flex circuit 18 are rapidly heated to a calibrated second temperature that exceeds the first temperature. The second temperature is sufficient for melting the solder paste to a molten state. To optimize the integrity of the resulting conductive joint, peak temperature is closely controlled during the reflow process to a temperature level exceeding the liquidus temperature of the molten materials forming the joint, e.g., by about 20-40° C. A controlled time-above-liquidus (TAL) is thereafter held for a predetermined duration, usually about 1-2 minutes.

Once the reflow process is finished, the PCB 16 and the flex circuit 18 are rapidly cooled such that the solder paste crystalizes and bonds to the PCB 16 and flex circuit 18. The finished electrical circuit, e.g., the PCBA 140 of FIG. 2 or the alternative embodiment of FIG. 6, or the ICB assembly 14 of FIG. 1, may be cleaned and dried as part of a post-reflow process, such as by using deionized water and/or solvents. The generally-described SMT soldering process may be applied to the various hardware embodiments disclosed above and shown in FIGS. 1-9 in order to construct the ICB assembly 14 and, ultimately, to manufacture the battery module 12 of FIG. 1.

Figure 12:
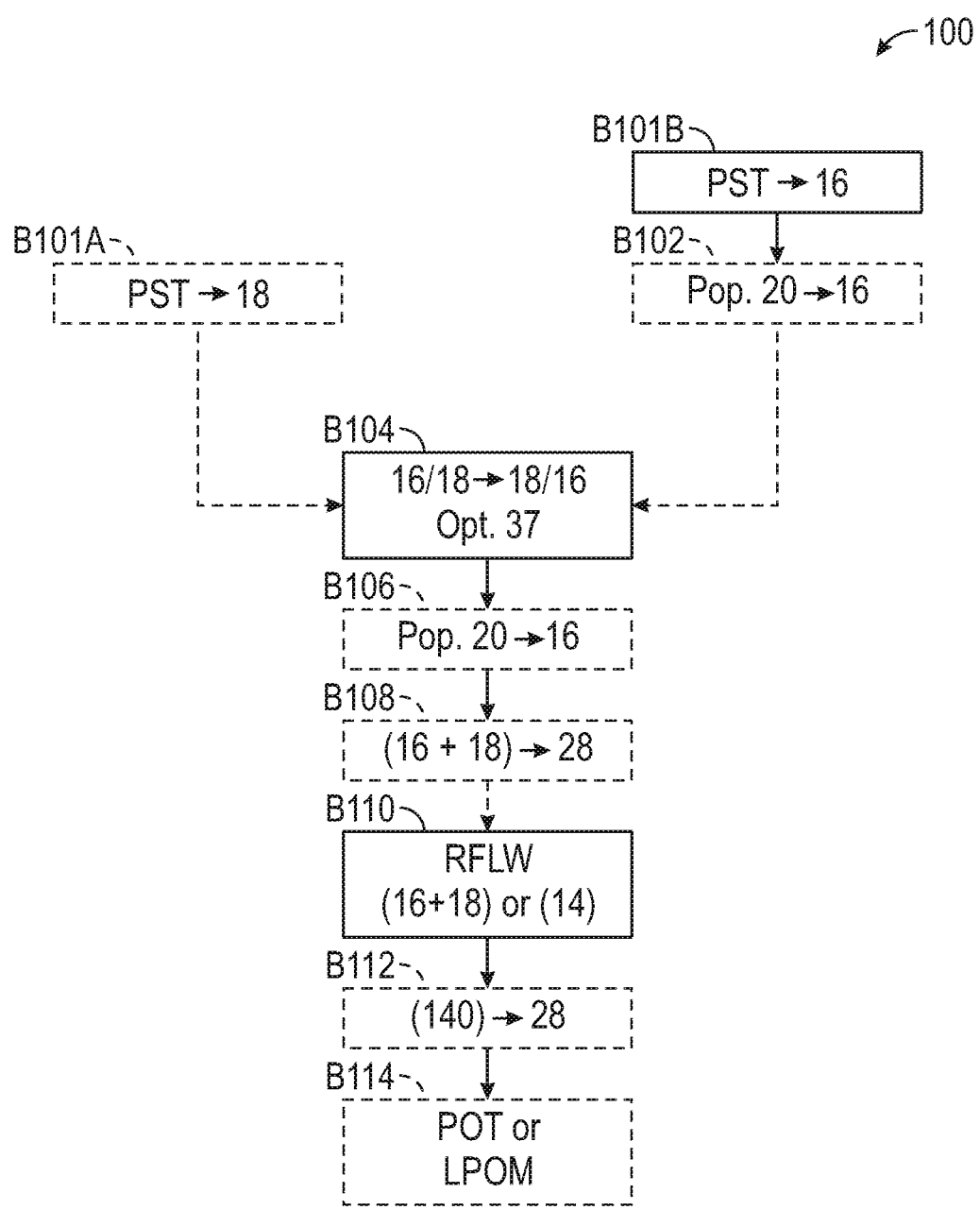
FIGS. 12 and 13 are flow charts describing example processes for manufacturing an ICB assembly for use in the example battery system of FIG. 1.

Referring to FIG. 12, an example method 100 for manufacturing the ICB assembly 14 and/or the PCBA 140 of FIG. 1 enables use of a single SMT oven reflow process to manufacture the PCBA 140, such as but not limited to embodiments in which the PCBA 140 is configured as shown in FIGS. 2 and 5-7. As will be clear from FIG. 12, reflow may be accomplished on an individual part basis or on larger format panels, e.g., several circuits simultaneously. The method 100 commences with blocks B101A and B101B with solder paste (PST) applied to the flex circuit 18 and/or the PCB 16, respectively. Block B101A is optional and dependent on the embodiment, i.e., if component surface 16C and flex interface surface 161 are on opposing surfaces, for instance, then solder paste may be optionally applied to the flex circuit 18 in lieu of applying additional solder paste to the PCB 16. Block B101B is used in the various embodiments for populating the component surface 16C with the electronic components 20. The method 100 then proceeds from block B101B to block B102, or from block B101A to block B104.

At block B102, the PCB 16 may be optionally populated with the cell sense electronic components 20, e.g., using a pick-and-place process. The PCB 16 thus acts as a main substrate for the components 20. The method 100 proceeds to block B104 once the PCB 16 has been populated by the electronic components 20 on the component surface 16C of the PCB 16.

At block B104, the flex circuit 18 described above with particular reference to FIG. 6, and the constructions shown in FIGS. 11C and 11D, is picked-and-placed onto the populated PCB 16, or the PCB 16 may be picked-and-placed onto the flex circuit 18 as in FIG. 5 and constructed as shown in FIGS. 11A and 11B. Block B104 may optionally include the use of the adhesive patches 37 shown schematically in FIG. 5, which collectively aid in temporarily retaining the flex circuit 18 with respect to the PCB 16. Although not visible from the perspective of FIG. 5, flex circuit 18 may be aligned with biasing, locating, or fiduciary holes or markings in/on the PCB 16 and/or the flex circuit 18, possibly in conjunction with tooling surfaces or pins on a machining jig. The method 100 then proceeds to block B110, possibly via intervening optional blocks B106 and B108.

Block B106 is analogous to block B102, with population of the PCB 16 by the components 20 possibly occurring at either block B102 or B106 of the method 100.

Optional block B108 includes nesting and/or joining the PCB 16 and flex circuit 18 to the carrier frame 28 of FIG. 1, i.e., mechanically connecting or locating the pre-populated PCB 16 and flex circuit 18 to the carrier frame 28 using locating features, heat staking and/or thin-film adhesives, snaps, screws, etc. The method 100 proceeds to block B110 once the PCB 16 and flex circuit 18 have been connected to the carrier frame 28.

At block B110, a reflow SMT soldering process (RFLW) is used to integrally join the PCB 16 and flex circuit 18, alone or as the ICB assembly 14, i.e., in conjunction with the carrier frame 28. When block B108 is not used, i.e., when the carrier frame 28 is not subjected to the above-noted SMT soldering process, the method 100 may include performing optional block B112.

Block B112 includes mounting the integrally-formed PCBA 140 to the carrier frame 28, and then proceeding to block B114. Mounting may be accomplished by nesting and/or attaching PCBA 140 by locating features, snaps, lugs, screws, etc.

Block B114 may include completing manufacture of the ICB assembly 14 using potting (POT) or low-pressure over-molding (LPOM) material 35 as described above.

Figure 13:
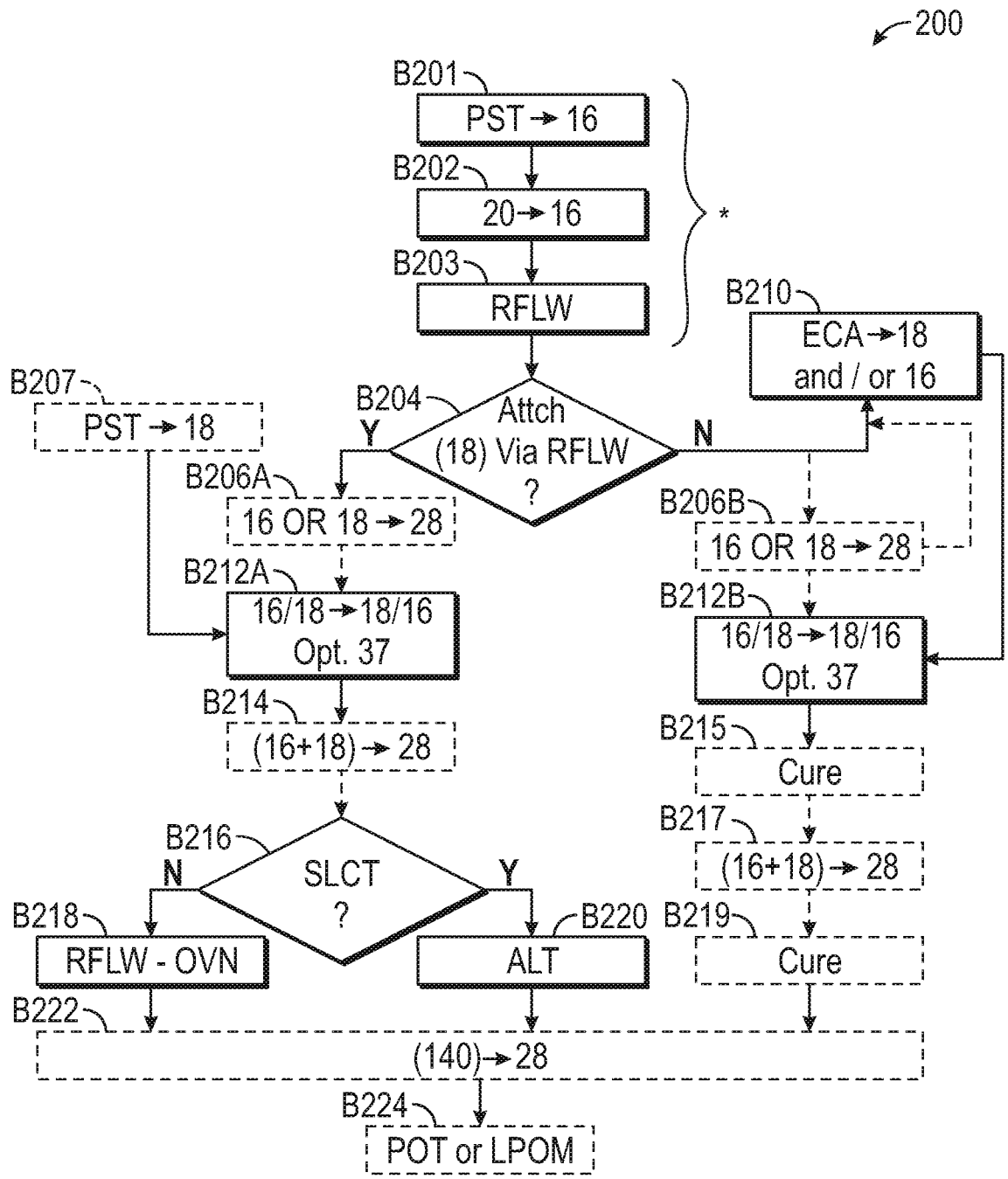

Referring to FIG. 13, the above process may be modified in some ways to implement a method 200. Method 200 enables pre-populated PCB 16 to manufacture the PCBA 140, with reflow performed on an individual part basis, or on larger format panels as noted above with reference to FIG. 12.

Block B201, B202, and B203, collectively identified as "*" in FIG. 12, may be used to pre-populate the PCB 16. For instance, block B201 may include applying solder paste to the PCB 16, then populating the PCB 16 with the electronic components 20 at block B202. The SMT soldering process is then conducted at block B203.

Block B204 may include determining whether to attach the flex circuit 18 using a reflow soldering process. If so (Y), the method 200 proceeds to block B206A. A no (N) decision at block B204 results in execution of block B206B and B210.

At block B206A and B206B, the PCB 16 or flex circuit 18 may be optionally nested or connected to the carrier frame 28. Block B206A is then followed by block B212A, while block B206B is followed by block B210 and/or block B212B.

Block B207 includes applying solder paste to the flex circuit 18, with optional block B207 then proceeding to block B212A.

Block B210 includes forming the requisite electrical connections between the PCB 16 and flex circuit 18 using heat-cured or room temperature-cured electrically-conductive adhesive (ECA) materials. The ECA materials may be applied to the flex circuit 18 and/or the PCB 16 at block B210. Non-limiting commercially-available ECA materials include electrically-conductive silicone, single or multi-component epoxy materials with silver or nickel-based filler, silver-filled polyurethane, or acrylic adhesives, among others. Isotropic ECA systems may be used in some embodiments, with large enough spacing, e.g., as shown in FIGS. 5-7, between landings 36 on the flex circuit 18 or PCB lands 65 and/or 66. A preferred ECA system will be anisotropic in nature, capable of electrically insulating in plane between traces or landings on the PCB 16 (65/66, 44) and/or flex circuit 18 (36, 60), but electrically conducting across/through the flex circuit interface 161 in communication with the PCB 16 and ultimately the cell sense electronic components 20 on the component surface 16C. Anisotropic ECA enables smaller pitch or spacing between landings shown in FIGS. 8-9. The ECA may be dispensed in liquid form, gel form, or applied as a thin-film adhesive or tape. The method 200 then proceeds to block B212B.

Blocks B212A and B212B are analogous to block B104 of FIG. 12, i.e., flex circuit 18 is picked-and-placed onto the populated PCB 16, or the PCB 16 may be picked-and-placed onto the flex circuit 18. In either case, the adhesive patches 37 of FIG. 5 may be applied in this block. The method 200 then proceeds from block B212A to block B214, or from block B212B to block B215.

Block B214 is analogous to block B108 of FIG. 12, and includes nesting and/or joining the PCB 16 and flex circuit 18 to the carrier frame 28 as described above. The method 200 proceeds to block B216 once the PCB 16 and flex circuit 18 have been connected to the carrier frame 28.

At optional block B215, the ECA applied in block B210 is cured to electrically join PCB 16 and flex circuit 18. The carrier frame 28 may be present in the curing process. ECA curing may be done at room temperature, by pressure, by oven, and/or with a local application of heat by contact method (i.e. temperature or electrically controlled tool, such as a hot bar press or thermode) or by non-contact method, (inductive methods or by light beam). Snap features or other fastener features in carrier frame 28 may be utilized to aid curing by application of pressure. Block B215 thereafter proceeds to optional block B217.

Block B216 includes determining whether further conductive bonding will be selective (SLCT) or global. That is, the SMT soldering process may be selective in nature, i.e., the flex circuit 18-to-PCB 16 interface/flex interface surface 161 alone may be soldered, with the PCB 16 being prepopulated with the cell sense components 20 as noted above. Such selective soldering enables the use of the carrier frame 28 as a manufacturing jig. When the carrier frame 28 is constructed of molded plastic, for instance, local heating of the various solder pads of the ICB assembly 14 should not damage or deflect the plastic, with some plastic materials possibly used that are capable of withstanding global reflow soldering temperatures.

If not selective, block B216 proceeds to block B218, with block B220 performed in the alternative when further conductive bonding will be selective in nature.

Block B217 optionally includes joining the PCB 16 and flex circuit to the carrier frame 28 if this has not already been accomplished by optional blocks B206B and B212B. Block B217 proceeds to optional block 219 once the carrier frame 28 is attached.

At block B218, the PCB 16, flex circuit 18, and possibly the carrier frame 28 are globally subjected to a reflow SMT soldering process, e.g., by passing through an SMT soldering oven. The method 200 then arrives at block B222.

At block B219, the ECA applied in block B210 may optionally be cured to join the PCB 16 and flex circuit 18, with the carrier frame 28 optionally present from block B217. Once cured, the method 200 proceeds to block B222.

Block B220 includes performing an alternative (ALT) selective process for conductively joining the PCB 16 and flex circuit 18, and possibly the carrier frame 28. Non-limiting example approaches in block B220 include hot bar soldering, light beam soldering, and laser soldering. The method 200 then proceeds to block B222.

At block B222, the PCBA 140 is joined to the carrier member 28 if, as noted above, this has not already occurred by block B214 or by block B217. The method 200 then proceeds to block B224.

Optional block B224, which is analogous to block B114 of FIG. 12, includes completing the manufacture of the ICB assembly 14 using potting (POT) or low-pressure over-molding (LPOM) materials 35 as described above.

In the above-described methods 100 and 200, the PCB 16 may be pre-populated with the various components 20 before mating the PCB 16 to the flex circuit 18. Alternatively, the PCB 16 may be populated simultaneously or subsequently with respect to placement of the flex circuit 18, such that the flex circuit 18 is treated as another SMT component. Likewise, the above methods 100 and 200 are conducive to simultaneous manufacturing of large batches or panels of the PCBA 140. In the case of mating a pre-populated PCB 16 to the flex circuit 18, it may be advantageous to utilize a form of selective reflow soldering or electrically conductive adhesive as opposed to a global reflow process.

As noted above, the adhesive patches 37 of FIG. 5 may be used in conjunction with the various process steps to temporarily affix the flex circuit 18 and PCB 16 to each other, e.g., prior to subjecting the PCBA 140 to the SMT reflow process or ECA curing process. Fiduciary or alignment holes in the flex circuit 18 and PCB 16, the latter of which is shown as the holes 59 of FIG. 9, may be used to ensure correct alignment, e.g., of the various solder lands 36 of FIGS. 5 and 6, the solder pads 65, 66, and/or 68 of FIG. 7, the solder lands 44, 46, and 48 of FIG. 8, or the solder lands 60 of FIG. 9.

While the best modes for carrying out the disclosure have been described in detail, those familiar with the art to which this disclosure relates will recognize various alternative designs and embodiments lying within the scope of the appended claims. It is intended that matter contained in the above description and/or shown in the accompanying drawings, unless otherwise noted, shall be interpreted as illustrative and not limiting.

The invention claimed is:

1. A method of manufacturing an interconnect board (ICB) assembly for a battery module having a plurality of battery cells, the ICB assembly having a printed circuit board assembly (PCBA) and a carrier frame, the method comprising:
   depositing solder paste onto at least one of a printed circuit board (PCB) and a flexible printed circuit (flex circuit), the flex circuit having a conductive foil substrate coated with insulating material and defining a plurality of tabular flying leads that radially-project from a periphery of the flex circuit;
   positioning the PCB immediately adjacent to the flex circuit such that the PCB and the flex circuit are in direct contact along a flex interface surface of the PCB;
   integrally joining the PCB and the flex circuit along the flex interface surface to form the PCBA; and
   connecting the PCBA to the carrier frame to construct the ICB assembly.

2. The method of claim 1, wherein integrally joining the PCB and the flex circuit includes subjecting the PCB and the flex circuit to a reflow soldering process.

3. The method of claim 2, wherein integrally joining the PCB and the flex circuit and connecting the PCBA to the carrier frame are conducted concurrently via the reflow soldering process.

4. The method of claim 1, wherein integrally joining the PCB and the flex circuit includes using heat-cured or a room temperature-cured electrically-conductive adhesive materials.

5. The method of claim 1, further comprising: populating a component surface of the PCB with electronic components that are collectively configured to measure parameters of the battery module.

6. The method of claim 1, wherein depositing solder paste onto at least one of the PCB and the flex circuit includes depositing solder paste onto a plurality of discrete solder pads or lands of the flex circuit.

7. The method of claim 6, wherein the conductive foil substrate is aluminum and the plurality of solder pads or lands are copper deposited or plated on the conductive foil substrate.

8. The method of claim 1, wherein the carrier frame includes a plurality of busbars, further comprising: conductively joining the PCBA to the plurality of busbars.

9. The method of claim 8, further comprising:
   seating the PCBA on a support surface of the carrier frame such that each respective one of the flying leads is adjacent to a corresponding one of the busbars;
   wherein conductively joining the PCBA to the plurality of busbars includes conductively joining an uninsulated portion of the flying leads to a respective one of the busbars.

10. The method of claim 9, wherein conductively joining the PCBA to the plurality of busbars includes using a laser welding process, an ultrasonic welding process, a resistance welding process, or a conductive adhesive material to join the flying leads to the busbars.

11. The method of claim 8, further comprising: applying potting or over-molding material to coat at least a portion of the carrier frame and at least a portion of the PCBA.

12. The method of claim 1, further comprising: populating at least one component surface of the PCB with electronic components prior to integrally forming the PCB and flex circuit.

13. A method of manufacturing a battery module having a plurality of battery cells and an interconnect board (ICB) assembly, the ICB assembly having a printed circuit board assembly (PCBA) and a carrier frame, the method comprising:
   depositing solder paste onto at least one of a printed circuit board (PCB) and a flexible printed circuit (flex circuit), the flex circuit having a conductive foil substrate coated with insulating material and defining a plurality of tabular flying leads that radially-project from a periphery of the flex circuit;
   populating a component surface of the PCB with electronic components that are collectively configured to measure parameters of the battery module;
   positioning the PCB immediately adjacent to the flex circuit such that the PCB and the flex circuit are in direct contact along a flex interface surface of the PCB;
   integrally joining the PCB and the flex circuit along the flex interface surface to form the PCBA;
   connecting the PCBA to the carrier frame to construct the ICB assembly, including conductively joining an uninsulated portion of each the flying leads to corresponding conductive busbar of the carrier frame; and
   conductively joining the ICB assembly to the battery cells to form the battery module.

14. The method of claim 13, wherein integrally joining the PCB and the flex circuit includes subjecting the PCB and flex circuit to a reflow soldering process.

15. The method of claim 14, wherein integrally joining the PCB and the flex circuit and connecting the PCBA to the carrier frame are conducted concurrently via the reflow soldering process.

16. The method of claim 13, wherein integrally joining the PCB and the flex circuit includes using heat-cured or room temperature-cured electrically-conductive adhesive materials.

17. The method of claim 13, wherein depositing solder paste onto at least one of the PCB and the flex circuit includes depositing solder paste onto a plurality of discrete solder lands of the flex circuit.

18. The method of claim 13, wherein conductively joining the ICB assembly to the battery cells includes welding each respective one of the busbars to a corresponding one of the battery cells.

19. The method of claim 13, further comprising: applying potting or over-molding material to coat at least a portion of the carrier frame and at least a portion of the PCBA.

20. The method of claim 13, wherein the carrier frame defines at least one cavity in conjunction with the PCBA, and wherein applying potting or over-molding material includes injecting the potting or over-molding material into the at least one cavity.

\* \* \* \* \*